US010592028B2

(12) United States Patent
Clark et al.

(10) Patent No.: US 10,592,028 B2
(45) Date of Patent: Mar. 17, 2020

(54) TOUCH SENSOR FEEDLINES FOR DISPLAY

(71) Applicant: Sharp Kabushiki Kaisha, Sakai, Osaka (JP)

(72) Inventors: Nick Clark, Oxford (GB); Tim Michael Smeeton, Oxford (GB)

(73) Assignee: SHARP KABUSHIKI KAISHA, Sakai (JP)

( * ) Notice: Subject to any disclaimer, the term of this patent is extended or adjusted under 35 U.S.C. 154(b) by 47 days.

(21) Appl. No.: 15/942,036

(22) Filed: Mar. 30, 2018

(65) Prior Publication Data
US 2019/0302935 A1   Oct. 3, 2019

(51) Int. Cl.
*G06F 3/044*   (2006.01)
*G06F 3/041*   (2006.01)
*H01L 27/32*   (2006.01)

(52) U.S. Cl.
CPC .......... *G06F 3/0412* (2013.01); *H01L 27/323* (2013.01); *H01L 27/3218* (2013.01); *H01L 27/3276* (2013.01); *H01L 2227/323* (2013.01)

(58) Field of Classification Search
CPC ............ G06F 3/0412; H01L 27/3276; H01L 27/3218; H01L 27/323; H01L 2227/323
See application file for complete search history.

(56) References Cited

U.S. PATENT DOCUMENTS

| | | | | |
|---|---|---|---|---|
| 6,614,498 | B1* | 9/2003 | Tanaka | G02F 1/133514 349/106 |
| 8,922,512 | B2* | 12/2014 | Cok | G06F 3/044 345/173 |
| 9,158,420 | B2* | 10/2015 | Cok | G06F 3/0412 |
| 9,342,176 | B2* | 5/2016 | Kim | G06F 3/0412 |
| 9,459,751 | B2* | 10/2016 | Weaver | G06F 3/041 |
| 9,471,167 | B2* | 10/2016 | Lai | G06F 3/0412 |
| 9,696,835 | B2* | 7/2017 | Her | G06F 3/0412 |
| 2010/0214247 | A1* | 8/2010 | Tang | H03K 17/98 345/173 |
| 2014/0051318 | A1* | 2/2014 | Cok | G06F 3/044 445/24 |

(Continued)

OTHER PUBLICATIONS

Clark et al., "Touch Sensor for Display With Shield", U.S. Appl. No. 15/942,049, filed Mar. 30, 2018.

(Continued)

*Primary Examiner* — Carolyn R Edwards
(74) *Attorney, Agent, or Firm* — Keating & Bennett, LLP

(57) ABSTRACT

A display device includes a display panel including a plurality of sub-pixels, a touch sensor electrode that is made of a first conductive and opaque material layer that is located directly on the display panel and overlaps a portion of the display panel in between a portion of the plurality of sub-pixels, and a feedline that is made of a second conductive and opaque material layer that is connected to the touch sensor electrode, overlaps a portion of the display panel in between some of the plurality of sub-pixels that is not overlapped by the touch sensor electrode, defines a pair of conductors around a sub-pixel in one or more columns of sub-pixels of the plurality of sub-pixels such that the pair of conductors are electrically connected above and below each sub-pixel in the one or more columns, and routes the touch sensor electrode to a touch sensor controller.

20 Claims, 6 Drawing Sheets

(56) References Cited

U.S. PATENT DOCUMENTS

| | | | | |
|---|---|---|---|---|
| 2015/0268754 | A1* | 9/2015 | Chang | G09G 3/3413 |
| | | | | 345/175 |
| 2015/0339969 | A1* | 11/2015 | Gu | G09G 5/02 |
| | | | | 345/77 |
| 2016/0170541 | A1* | 6/2016 | Iwami | G06F 3/044 |
| | | | | 345/174 |

OTHER PUBLICATIONS

Clark et al., "Touch Sensor for Display", U.S. Appl. No. 15/942,060, filed Mar. 30, 2018.
Clark et al., "Touch Sensor for Display With Improved Viewing Angle Uniformity", U.S. Appl. No. 15/942,064, filed Mar. 30, 2018.

* cited by examiner

TOUCH SENSOR FEEDLINES FOR DISPLAY

BACKGROUND OF THE INVENTION

1. Field of the Invention

The present invention is directed to a touch sensor for an electronic display system. More specifically, the present invention relates to feedlines of a self-capacitive touch sensor provided directly on an electronic display panel and a method of fabricating the same.

2. Description of the Related Art

An electronic display is a device, panel, or screen that visually presents images, text, or video that is transmitted electronically. Examples of electronic displays are used as components in televisions, computer monitors, digital signage, smart phones, and tablet computers. Display devices can either emit light, i.e., emissive type, or modulate light, i.e., non-emissive type.

An organic light emitting-diode (OLED) display device is an emissive type electronic display that includes an organic light emitting display panel and driver electronics to control the organic light emitting display panel. The organic light emitting display panel includes a matrix of pixels with each pixel including an organic light emitting-diode and a driving thin-film transistor (TFT). OLED displays are multi-color with a wide viewing angle, high contrast, and fast response speed.

An OLED display panel includes a pixel layer having colored sub-pixels, typically a combination of red, green, and blue (R, G, B). The pixel layer is typically constructed with two electrodes and an organic light-emitting layer between the two electrodes. The two electrodes include an anode electrode and a cathode electrode, which are applied with different voltages. The pixel layer is usually protected by an encapsulation or a sealing layer that may include multiple thin layers or a sealing substrate.

A liquid crystal display (LCD) is a non-emission type display that includes a liquid crystal panel and driver electronics to control the liquid crystal panel. LCD panels include a series of cells that can each be driven independently to modulate input light. An active-matrix liquid-crystal display (AMLCD) includes a matrix of cells or sub-pixels with each sub-pixel including a switching TFT. The TFTs store the electrical state of each sub-pixel on the display while all the other sub-pixels are being updated. The sub-pixels typically include a corresponding red, green, or blue color filter driven in combination to form a color gamut.

A typical LCD includes an array substrate including the TFTs and connecting signal lines, an opposing substrate including the color filter, and a liquid crystal layer in between the two substrates. The driving electronics are used to create a voltage potential between a pixel electrode and a common electrode at each pixel to modulate adjacent liquid crystals in the liquid crystal layer.

The OLED displays and LCDs are increasingly popular, but other pixelated emissive and non-emissive type electronic display technologies are also well known.

Touch screens are widely used with electronic displays, especially for smart phones and mobile electronic devices. A touch sensor or screen is an input device that can be joined with an electronic display device to facilitate user interaction and control. Such devices typically include a touch screen mounted on a surface of an electronic display that displays interactive information.

Touch screens detect the location of an external touch or gesture of a finger, stylus, or similar object that occurs at or near the surface of the touch screen. Such touch screens include a matrix of transparent conductive elements or electrodes that form a touch sensor that overlay the display device and separate control electronics to determine the location of the touch object near or in contact with the touch sensor. Touch screens are typically transparent so the user can view displayed information on the display device through the touch-screen. By physically touching, or nearly touching, the touch sensor in a location associated with displayed information, a user can select an operation associated with the displayed information. The touch sensor detects the touch and then electronically interacts with the control electronics, or controller, to determine and output the touch location. The output signal of the touch location is input to a processor that associates the touch location or gesture with the displayed information to execute a programmed task associated with the displayed information as a graphic user interface.

Touch screens can use a variety of technologies, including resistive, inductive, capacitive, acoustic, piezoelectric, and optical technologies, to locate a touch or gesture on a sensor.

Capacitive touch-screens are of at least two different types: self-capacitive and mutual-capacitive. Self-capacitive touch-screens use an array of transparent electrodes on the sensor in combination with the touching object to form a temporary capacitor, a capacitance of which is detected. Mutual-capacitive touch-screens use an array of transparent electrode pairs that form capacitors, a capacitance of which is affected by the touching object. In both types, each capacitor in the array is sensed to detect a touch, and the physical location of the touch-detecting electrode in the touch-screen corresponds to the location of the touch.

As mentioned, touch sensors are typically transparent or formed to be invisible to the user and minimize optical distractions and artifacts. While interacting with the display panel, the touch sensor should minimize ambient reflection, maximize display transmission, not significantly reduce the range of possible viewing angles, and not cause any Moiré patterns or other optical interference effects. Electrically, the touch sensor should be highly conductive and uniform to maximize sensitivity and minimize voltage potential gradients. Touch sensors are either transparent conductive materials or conductive elements that are spaced apart and are too small to be seen by the user.

A typical transparent touch sensor includes a patterned coating of a conventional transparent conducting material (TCM) such as a transparent conducting oxide (TCO) or indium tin oxide (ITO). Disadvantages of such designs include limited transparency and conductivity and increased sensitivity to mechanical or environmental stress. Thicker layers of conventional TCM increase conductivity and resistance to stress but reduce the transparency of the electrodes.

For increased conductivity and to overcome issues of touch sensors made from conventional TCM, touch screen sensors can be made from grid patterns of fine metal wires, meshes, or conductive traces. These micro-wires are opaque, but are meant to be fine enough and spaced apart so that they are normally not detectable by the user. Although more uniformly conductive than conventional TCM designs, patterns of micro-wire electrodes can visibly interact with pixels in a display and cause Moiré patterns and other optical interference artifacts.

In order to reduce the device thickness as much as possible, the touch sensor can be formed directly on the display, and the display and touch sensor can be manufactured in the same process. This can result in the reduction of production costs compared with production of the display and touch sensor as separate components and subsequently combining them together. However, because a manufacturing defect in the touch sensor results in the wasted production of the display, features that increase the manufacturing yield of the touch sensor are desired.

SUMMARY OF THE INVENTION

To overcome the problems described above, a preferred embodiment of the present invention provides a display device including a display panel including a plurality of sub-pixels; a touch sensor electrode that is made of a first conductive and opaque material layer that is located directly on the display panel and overlaps a portion of the display panel in between a portion of the plurality of sub-pixels; and a feedline that is made of a second conductive and opaque material layer that is connected to the touch sensor electrode, overlaps a portion of the display panel in between some of the plurality of sub-pixels that is not overlapped by the touch sensor electrode, defines a pair of conductors around a sub-pixel in one or more columns of sub-pixels of the plurality of sub-pixels such that the pair of conductors are electrically connected above and below each sub-pixel in the one or more columns, and routes the touch sensor electrode to a touch sensor controller.

Another preferred embodiment of the present invention provides a plurality of sub-pixels of a display panel including a series of sub-pixels that are adjacent to each other; a touch sensor electrode that is made of a first conductive and opaque material layer that is located directly on the display panel and overlaps a portion of the display panel in between a portion of the plurality of sub-pixels; and a feedline that is made of a second conductive and opaque material layer that is connected to the touch sensor electrode, overlaps a portion of the display panel in between some of the plurality of sub-pixels that is not overlapped by the touch sensor electrode, defines a pair of conductors around a sub-pixel in the series of sub-pixels such that the pair of conductors are electrically connected adjacent to opposite corners of each sub-pixel in the series of sub-pixels, and routes the touch sensor electrode to a touch sensor controller.

The above and other features, elements, characteristics, steps, and advantages of the present invention will become more apparent from the following detailed description of preferred embodiments of the present invention with reference to the attached drawings.

DETAILED DESCRIPTION OF PREFERRED EMBODIMENTS

Figure 1A:
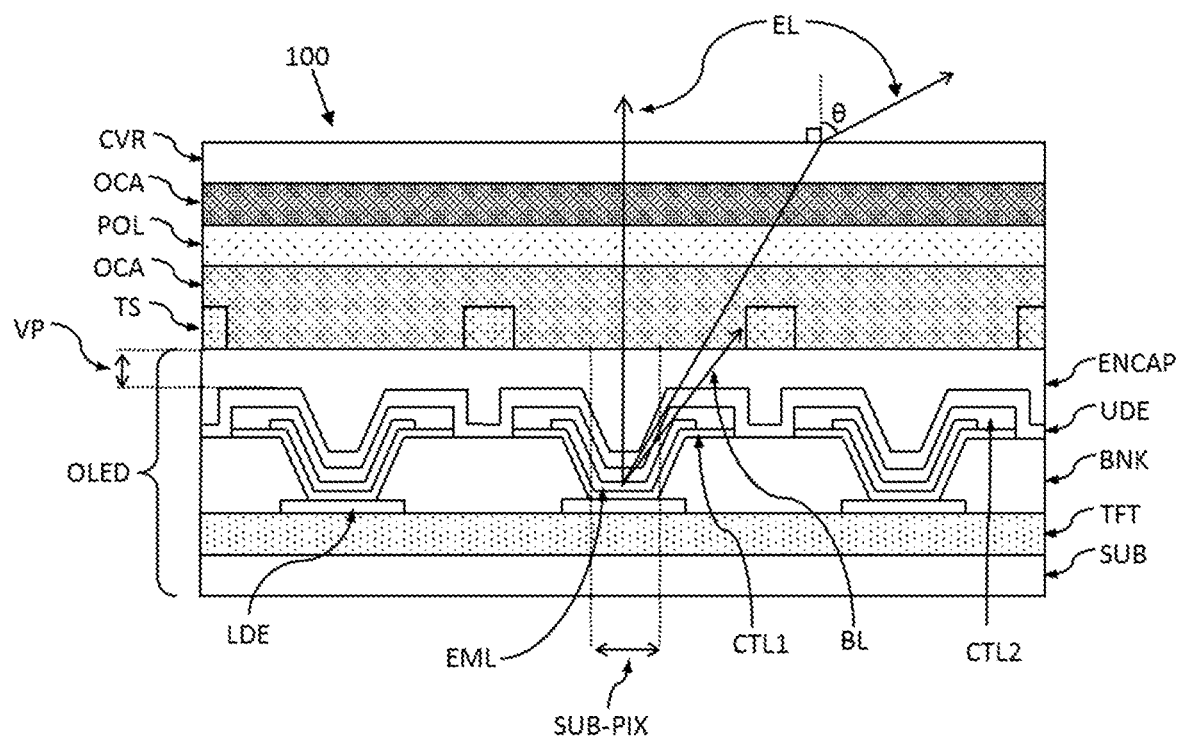
FIG. 1A is a side view of an OLED display panel and a touch sensor according to a preferred embodiment of the present invention.

Preferred embodiments of the present invention provide self-capacitive touch sensors for use with electronic displays. In a preferred embodiment of the present invention, a touch sensor pattern layer can be formed or disposed directly on the encapsulation layer of an OLED pixel layer or a substrate of an LCD closest to the sub-pixels and connected to a touch sensor controller to detect an external touch input. For convenience, the touch sensors of various preferred embodiments of the present invention will be described below with respect to an OLED display, but one of ordinary skill in the art will appreciate that the present touch sensors can be used with LCDs or any suitable electronic display technology.

A display panel includes a collection of sub-pixels on a TFT substrate and covered with a continuous transparent encapsulation material or substrate. The touch sensor includes a collection of touch electrodes and associated feedlines which connect the touch electrodes to a touch sensor controller. This creates a touch system that detects the position, in up to 3 dimensions, of a touch object relative to the display. The assembly of both the display panel and the touch sensor is referred to as the display device.

As noted above, self-capacitive operation means that the capacitance of an electrode is measured between the touch electrode and ground, a reference voltage of the touch sensor controller, or another portion of a display. In a mutual-capacitive operation, the capacitance is measured between different touch electrodes. Self-capacitive designs have the advantage of being more sensitive than mutual-capacitive designs.

Rather than combining two separate display panel and touch sensor components, the touch sensors of preferred embodiments of the present invention can be formed or disposed directly on the display panel to significantly reduce or minimize thickness.

A number of challenges and design requirements exist when developing a touch sensor for operation with an electronic display. The touch sensor wiring and an adjacent electrode of the display panel can create a parasitic capacitance. By reducing the distance between a touch electrode or feedline and an electrode on the display, electromagnetic forces between the touch electrode or feedline and the electrode on the display panel will generate increased parasitic capacitance. This can be best illustrated by the well-known parallel plate capacitor equation, $C=\varepsilon A/d$ where, d is the distance between the touch electrode or feedline and the display electrode at the reference potential, $\varepsilon$ is the permittivity of the dielectric separating the touch electrode, and A is the area overlapping between the touch electrode or feedline and the display electrode at the reference potential. A touch sensor formed directly on an OLED display is therefore susceptible to high parasitic capacitances. In particular, the OLED cathode electrode may be formed directly below the encapsulation layer and only separated from the touch electrodes and feedlines by, for example, 10 μm. This distance is shown as the vertical proximity VP in FIG. 1A.

It is advantageous to significantly reduce or minimize parasitic capacitance that is created between the touch sensor electrode or feedline and a closest electrode of the OLED sub-pixel. First, the touch electrode and the feedline that connects the touch electrode to the touch controller form a series resistor-capacitor (RC) circuit where the voltage across the capacitor has an exponential response with a time-constant related to the RC. Therefore, reducing the parasitic capacitance reduces the charge time of the capacitor formed by a touch of a user of the touch panel to allow faster operation. Second, many available touch sensor controllers impose limits on the size of the parasitic capacitance and by reducing the absolute parasitic capacitance, the preferred embodiments of the present invention offer the widest compatibility with available touch sensor controllers.

To allow for a wide range of user input and compatibility with modern software systems, touch sensors require the ability to simultaneously detect multiple user touches. For a self-capacitive design, this can only be achieved by sensing of individual touch electrodes. Individual electrode sensing requires that each electrode is fed by an individual feedline routed past adjacent touch electrodes. In conventional designs, owing to the low conductivity of the feedline material, the feedlines are made wide to keep their resistance low. For larger panels, the wide feedlines necessitate large spacing between touch electrodes. The increase in touch electrode pitch will reduce touch resolution.

Further, wide feedlines can necessitate use of touch electrodes of varying size to ensure sufficient space for passing feedlines and varying sizes of the touch electrodes introduces non-uniformity of parasitic capacitance and sensitivity between touch electrodes causing poor sensitivity and inconsistent touch response across the touch sensor. To reduce the difference in capacitance values or dynamic range among the touch electrodes, maintain sensitivity across the touch sensor, and minimize the complexity and cost of the touch sensor controller, it is desirable that the capacitance, the RC constant, the size of touch electrodes, and the spacing between them be controlled and uniform across the touch sensor.

It is noted that a portion of the parasitic capacitance is attributed to the touch electrode and another portion of the parasitic capacitance is attributed to its associated feedline. False detection occurs when the touch sensor incorrectly reports the detection of the touch object due to the touch object's effect on the capacitance of the feedline. That is, a change in capacitance of a feedline caused by a touch object can be wrongly interpreted as touch to be detected at the electrode that the feedline is connected to. Therefore, for the same reasons as outlined above, it is advantageous to reduce the parasitic capacitance and the sensitivity, i.e., maximum change in capacitance on the introduction of the touch object to the feedlines.

As mentioned above, a small RC constant is desired. Therefore, it is beneficial to increase the material conductivity to reduce the resistance of the feedlines and touch electrodes. In addition to making the design more tolerant to high capacitances, higher conductivity/lower resistance materials allow for longer feedlines, larger touch sensor designs, and reduced power consumption.

With respect to optical performance of the display panel combined with the touch sensor, any light emitted by or through the display panel but blocked by the touch sensor will require more power to match the light output of a display panel without touch capability. This must be considered across the full range of viewing angles. For instance, in the case of a touch sensor including touch electrodes or feedlines of opaque material according to a preferred embodiment of the present invention, increases in the thickness of the opaque material, reduction in the horizontal proximity between the opaque material and emissive regions, and an increase in the vertically proximity between the opaque material and emissive regions of the display panel may cause blocking of emitted light that would otherwise be emitted, as shown for the light labelled BL in FIG. 1A. Also, any non-uniformity in the appearance, caused by both the emitted light and the reflected ambient light, of the display panel with touch sensor detracts from its optical quality.

Preferred embodiments of the present invention solve the above described problems as described in detail below.

Figure 1B:
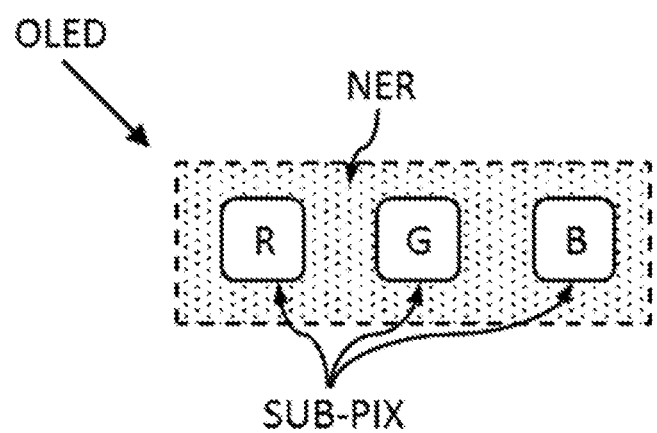
FIG. 1B is a plan view of a portion of the OLED display device of FIG. 1A.

FIG. 1A is a side view of a display device 100 including an OLED display panel OLED and touch sensor TS of a preferred embodiment of the present invention. As shown in FIG. 1A, the display device 100 includes a substrate SUB, a TFT layer TFT on the substrate SUB, a lower display electrode LDE and a bank BNK on the TFT layer TFT, an OLED sub-pixel SUB-PIX on the lower display electrode LDE, an upper display electrode UDE on the OLED sub-pixel SUB-PIX, and an encapsulation layer ENCAP covering the OLED sub-pixel SUB-PIX define the OLED display panel OLED. FIG. 1A shows three OLED sub-pixels SUB-PIX. FIG. 1B is a plan view of the OLED display panel OLED showing three OLED sub-pixels SUB-PIX. Light is emitted from the OLED sub-pixels SUB-PIX, and regions in between OLED sub-pixels SUB-PIX are non-emissive regions NER. In FIG. 1A, the lower and the upper display electrodes LDE, UDE can include a single cathode or anode electrode or a plurality of cathode or anode electrodes. As shown in FIG. 1A, the OLED sub-pixel SUB-PIX includes charge transport layers CTL1, CTL2 and a light emitting layer EML. A conductive and opaque material is provided on the encapsulation layer ENCAP and is patterned to define the touch electrodes and feedlines of the touch sensor TS in FIG. 1A. Unless otherwise stated, all references to conductive herein refer to electrically conductive. Optionally, a polarizer POL and/or cover material CVR can be laminated on the touch sensor TS with optically clear adhesive OCA.

As illustrated in FIG. 1A, the touch sensor TS is preferably patterned between and does not overlap the OLED sub-pixels SUB-PIX. Therefore, there is no reduction in emitted light EL at and close to the normal viewing angle. As shown, the emitted light EL is directly admitted. That is the light from the light emitting layer EML exits the display panel 100 without undergoing reflection or scattering at the various material interfaces in the display panel 100 structure. Also, as compared with a conventional transparent touch sensor that is continuous over the display panel, the parasitic capacitance between the touch sensor TS and upper display electrode UDE is reduced due to the reduced area of the touch electrodes and feedlines. The touch electrodes and feedlines may preferably be defined in a single layer of conductive and opaque material. This allows for low cost manufacturing. The conductive and opaque material can be, for example, one of titanium, aluminum, copper, silver, gold, molybdenum, zinc, tungsten, nickel, tin, platinum, graphene, or any alloy thereof, but is not limited thereto. Optionally, the conductive and opaque material of the touch sensor TS can be a stack of multiple layers, for example, a sequence of Ti/Al/Ti layers or combination of the other materials mentioned, but is not limited thereto. The same conductive and opaque material(s) is preferably deposited and patterned to define all of the touch electrodes and feedlines in a shared process, but different materials, different deposition processes, and different patterning processes may be used for the touch electrodes and feedlines.

It is also possible that the touch electrodes and feedlines can be at different layers in the display device structure. The conductive and opaque material may be deposited by evaporative coating in a vacuum and patterned using a standard photoresist and etch process, for example with a wet chemical etch or a reactive gas etch. Furthermore, because the touch sensor TS is preferably defined in a single layer of the conductive and opaque material, all of the conductive and opaque material is located close to the plane of the light emission from the OLED. This reduces the extent of, or eliminates, blocking of light from the OLED sub-pixels SUB-PIX which would otherwise propagate at high polar viewing angles (a polar viewing angle θ is shown in FIG. 1A). An example of a direction of blocked light BL is shown in FIG. 1A. This configuration is preferable instead of a configuration using conventional TCMs in thick layers because these materials are only partially transparent and cannot be used in thick layers without causing high absorption or reflection of light from the OLED sub-pixels SUB-PIX.

Preferably the conductive and opaque material has a conductivity significantly higher than that provided by conventional TCMs. Therefore, the parasitic capacitance of the touch electrodes and feedlines can be lowered without increasing resistance. Thus, the conductive and opaque material of touch sensors of preferred embodiments of the present invention can be very thin and narrow with low resistance.

Also, the conductivity of the conductive and opaque material of preferred embodiments of the present invention is high enough that a feedline may have a width small enough that the pitch between adjacent feedlines can be the same or substantially the same as the pitch of the sub-pixels, while not overlapping with these sub-pixels. Thus, the problems associated with wide feedlines discussed above is avoided. Furthermore, increased conductivity of feedlines allows for larger designs (i.e., touch sensors on display panels with larger areas such that the feedlines connecting electrodes to a touch panel controller are long) without their resistance becoming problematically high.

Figure 2:
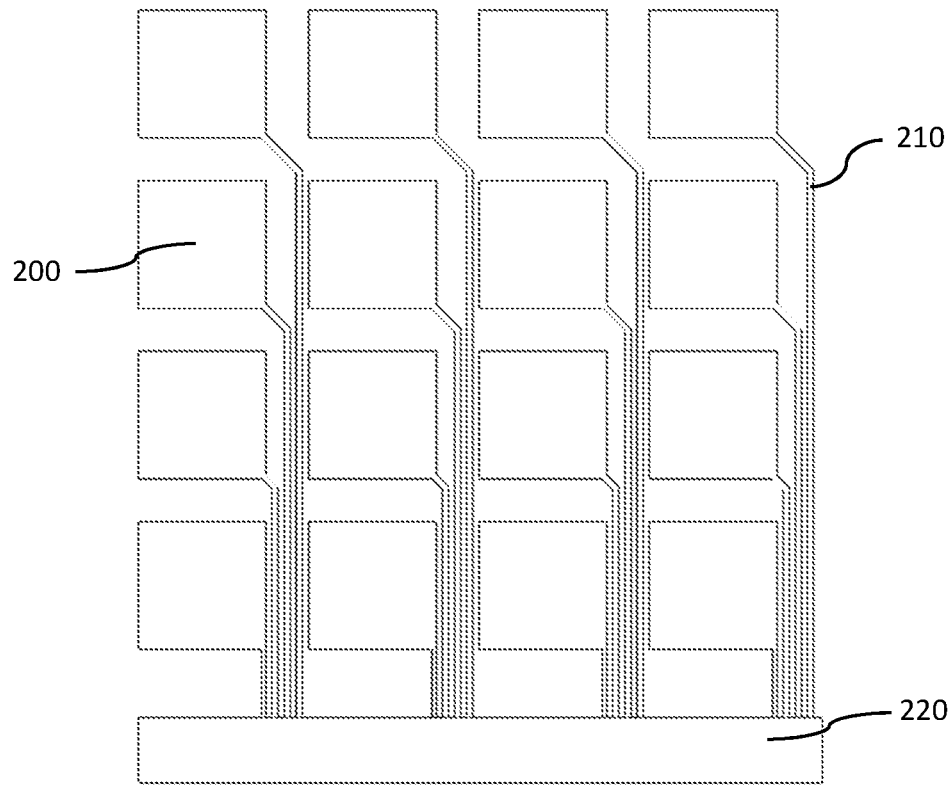
FIG. 2 is a plan view of a touch panel configuration according to a preferred embodiment of the present invention.

FIG. 2 shows an exemplary grid layout of the touch electrodes 200 with an individually connected feedline 210 according to a preferred embodiment of the present invention. The outlines of the touch electrode 200 and the connected feedline 210 in FIG. 2 indicate the outer extents of the touch electrodes 200 and feedlines 210; the structure whereby the touch electrodes 200 and feedlines 210 are not overlapping with the sub-pixels is not shown. At the sub-pixel scale, the edges of the touch electrodes 200 and feedlines 210 may not be straight lines, as in FIG. 2. In this configuration, not all of the sub-pixels of the display panel are enclosed within a touch electrode 200. As shown in FIG. 2, the feedlines 210 are routed to a touch sensor controller 220 that is at an edge of or off the display panel. Here, the feedlines 210 are routed to be parallel or substantially parallel to edges of a rectangular OLED display. The touch sensor controller 220 can be directly bonded to a substrate of the display panel or connected to the feedlines 210 using another connection method. Overall, FIG. 2 shows a self-capacitive touch sensor of a display panel made from a single layer of conductive and opaque material that has higher conductivity than conventional TCM devices, wherein the conductive and opaque material of the touch sensor does not overlap the sub-pixels.

Figure 3:
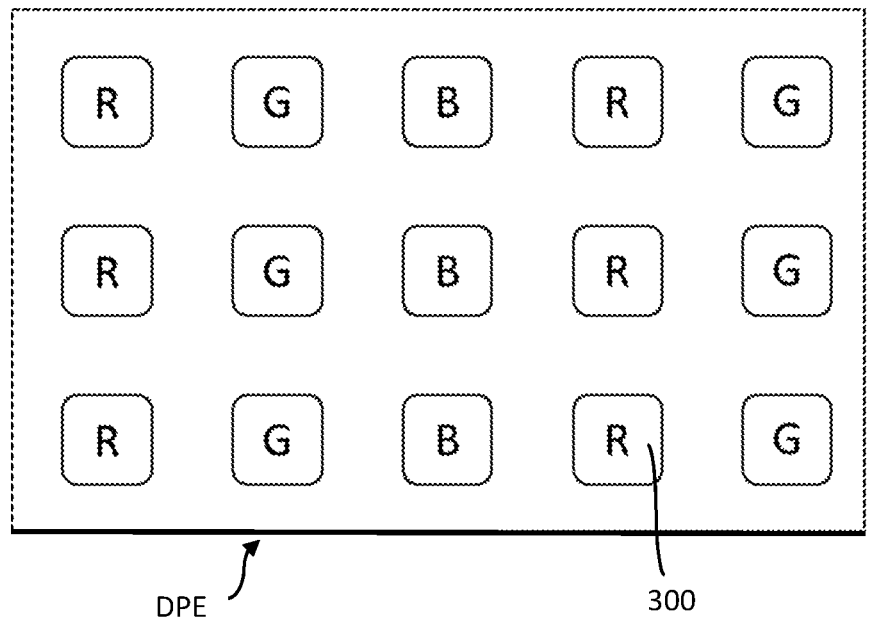
FIG. 3 shows a representative portion of an OLED display panel with a first sub-pixel distribution layout according to a preferred embodiment of the present invention.
Figure 4:
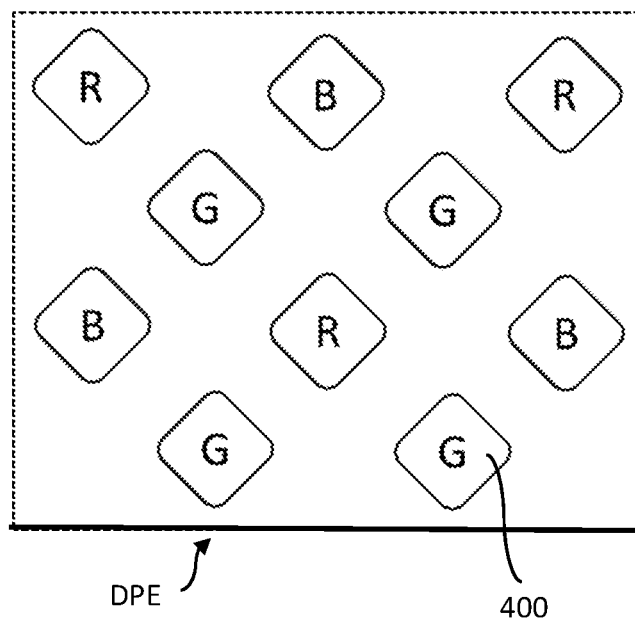
FIG. 4 shows a representative portion of an OLED display panel with a second sub-pixel distribution layout according to a preferred embodiment of the present invention.

The grid layout pattern of the touch electrodes and feedlines similar to that shown in FIG. 2 can be applied, but not limited to, different sub-pixel layouts and referred to as the first and second sub-pixel distributions, as shown in FIGS. 3 and 4.

FIG. 3 shows a representative portion of the OLED display panel with the first sub-pixel distribution layout where edges of sub-pixels (R, G, B) 300 are aligned parallel or substantially parallel with a rectangular display panel edge DPE.

FIG. 4 shows a representative portion of the OLED display panel with the second sub-pixel distribution layout where edges of sub-pixels (R, G, B) 400 are aligned at 45° or about 45° with the rectangular display panel edge DPE.

In all sub-pixel distributions, the sub-pixels can be of different sizes and shapes or of equal size (e.g., red sub-pixels may be different size and shape compared with green subpixels). The sub-pixels can be grouped into one or more groups of equal size and/or the same color. For example, the sub-pixel shape may be square, rectangular, rounded, have rounded corners, curved edges, or 5 or more straight edges. One sub-pixel may include more than one separate emissive region, each of which emits substantially the same color of light, for example.

The operation of the touch sensor involves the repeated measurement, simultaneously or in-turn, of the capacitance, with respect to a touch sensor controller reference voltage or ground, of each touch electrode. Optionally, the operation of the touch sensor involves the repeated measurement, simultaneously or in turn, of the capacitance, with respect to an electrode of the OLED (preferably the upper display electrode UDE), of each touch electrode. There are various techniques to measure capacitance, including but not limited to, Charge transfer, Delta-sigma modulation, Relaxation oscillator, and Charge time measurement. All techniques will involve the application of one or many voltage (the drive voltage) pulses to the touch electrodes such that an electric field is projected from the touch electrodes.

As discussed above, when a touch object comes within close proximity to the touch electrode, the interaction of the projected electric field from the touch electrode and the touch object causes a change in charge held on the touch electrode and, therefore, a change in its capacitance. Therefore, by detecting a change in capacitance, the presence of a touching object can be determined. Because the touch electrodes are patterned in a touch sensor array on the display panel, depending on which touch electrode indicates a change in capacitance, the location of the touch on the touch sensor and display panel can be determined.

Figure 1C:
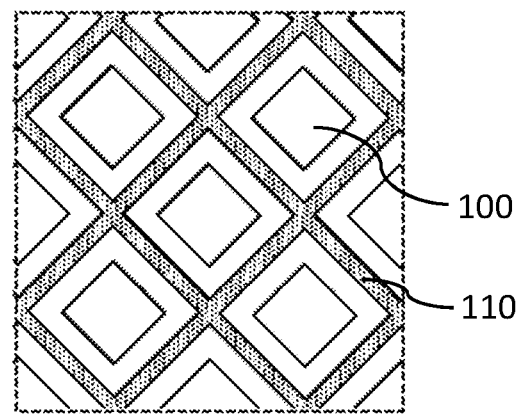
FIG. 1C show a representative region of a touch electrode in a preferred embodiment of the present invention.

FIG. 1C shows a region of a touch electrode 110 in a preferred embodiment of the present invention in a representative portion of the OLED display panel with the second pixel distribution. The conductive and opaque material of the touch electrode 110 is in between sub-pixels 100 and surrounds the sub-pixels 100.

Figure 5:
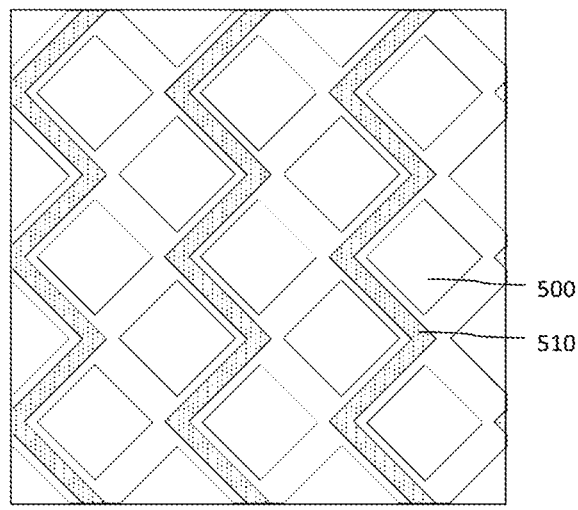
FIG. 5 shows feedlines in a preferred embodiment of the present invention in a representative portion of the OLED display panel with the second pixel distribution layout.

FIG. 5 shows feedlines 510 in a preferred embodiment of the present invention in a representative portion of the OLED display panel with the second pixel distribution layout. For a display panel with sub-pixel distribution as shown in FIG. 4, in which there is no straight line path parallel to the edges of the display panel substrate which does not overlap with the sub-pixels 500, the feedlines 510 cannot be easily provided in a straight line, and instead are preferably configured in the manner shown in FIG. 5. FIG.

5 shows that the feedlines 510 made of the conductive and opaque material are provided in a serpentine or zig-zag arrangement around the sub-pixels in the sub-pixel distribution shown in FIG. 4 where the main edges of the emissive regions of the sub-pixels are preferably at an angle of 45° or about 45° to the edges of the display. It is noted that the conductive and opaque material for the feedlines can be defined from a different conductive and opaque material or can be patterned in a separate step than the touch electrode.

Figure 6:
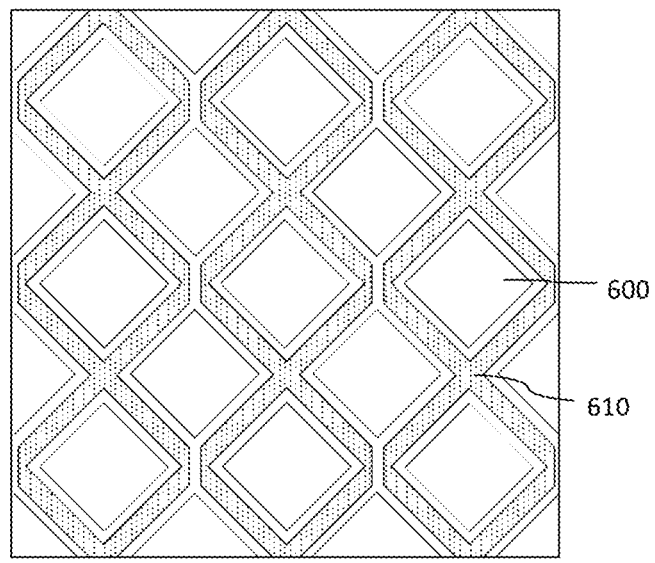
FIG. 6 shows feedlines in a preferred embodiment of the present invention in a representative portion of the OLED display panel with the second pixel distribution layout.

FIG. 6 shows feedlines 610 in another preferred embodiment of the present invention in a representative portion of the OLED display panel with the second pixel distribution layout. As shown in FIG. 6, the conductive and opaque material of the feedlines 610 fully surrounds the sub-pixels 600 of at least one column of sub-pixels along the length of the feedline. That is, each feedline 610 is patterned to form a pair of conductors around each sub-pixel in one or more sub-pixel columns such that the pair of conductors are electrically connected above and below each sub-pixel. With two conducting paths for each feedline 610, the probability of a touch sensor defect where a break in the conducting and opaque material pattern at a feedline 610 would be likely to cause a catastrophic failure in the display panel, is significantly reduced.

Figure 7:
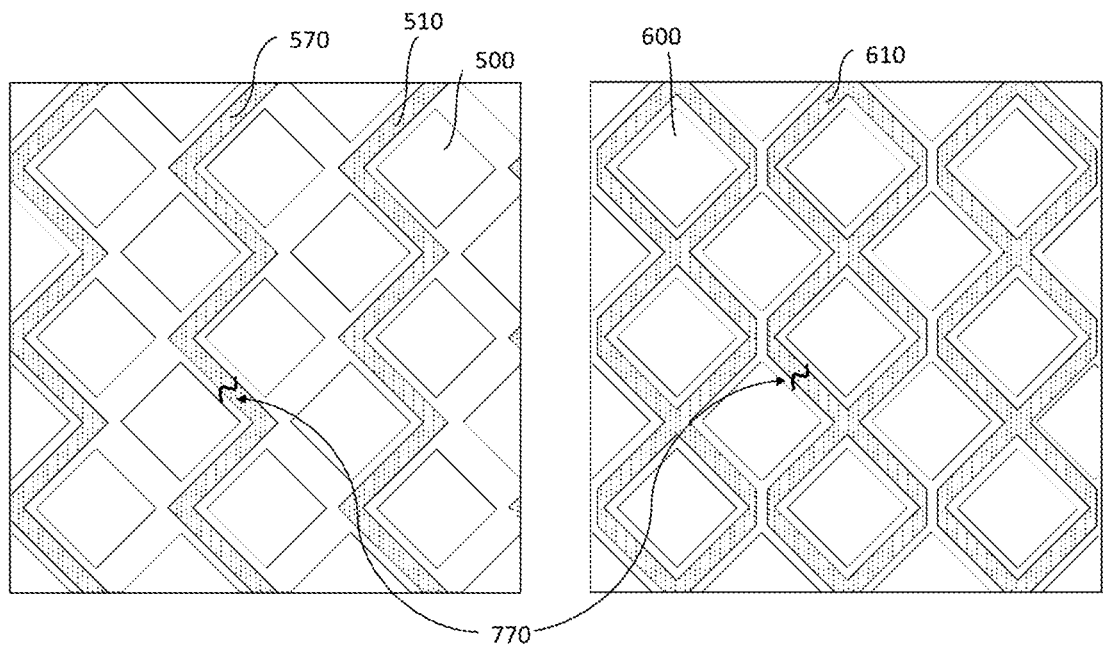
FIG. 7 illustrates a comparison between the patterns of feedlines shown in FIGS. 5 and 6.

FIG. 7 illustrates a comparison between the patterns of feedlines shown in FIGS. 5 and 6. The feedline pattern of FIG. 5 is shown in the left side of FIG. 7, and the feedline pattern of FIG. 6 is shown on the right side. FIG. 7 shows the respective sub-pixels 500, 600 and feedlines 510, 610. Reference character 770 represents a defect caused by a break or separation of the conductive and opaque material in feedlines 570 and 610 due to, for example, a manufacturing flaw or damage caused during operation. As shown, the feedline 570 has an open circuit between its associated touch electrode (not shown) and the touch sensor controller (not shown). This fatal defect prevents the associated touch electrode from operating and would lead to an area of the display panel that will have a reduced ability to sense touches. However, because of the redundancy in the alternative conducting path of feedline 610, the associated touch sensor will continue to operate. Therefore, the pattern of feedlines 610 as exemplified in FIG. 6 will improve display panel yield and reduce overall manufacturing costs. Furthermore, the improved yield and reliability of the feedline pattern of FIG. 6 is achieved without increasing the feedline pitch compared with the configuration shown in FIG. 5. This helps to avoid the problems associated with wide feedlines discussed above. The feedlines 610 do not require additional space and, therefore, it is not necessary to decrease the electrode size or increase the electrode pitch to accommodate the feedlines 610. Therefore, it is advantageous for the overall optical uniformity of the display device if feedlines form pairs of conductors around sub-pixels in every second column so that all sub-pixels of the same color have similar surrounding environment, for example, the green G sub-pixels 400 as in FIG. 4. Thus, the blocking of light by the conductive and opaque material can be similar for sub-pixels emitting the same color.

With the feedline pattern shown in FIG. 6, average coverage of the display panel by conductive and opaque material is highly uniform across the display panel. In feedline regions, the conductive and opaque material coverage is very similar to the coverage in touch electrode regions (e.g., as in FIG. 1C). The coverage of the conductive and opaque material is defined as the area fraction of the conductive and opaque material in a plan view, averaged over an area of at least a 2×2 array of sub-pixels. An advantage of the similar coverage of the conductive and opaque material in the touch electrode regions and feedline regions according to various preferred embodiments of the present invention is that the appearance of the display is very similar in these two regions. For example, the reflection of ambient light is similar, thereby reducing the visibility of the differences between the touch electrode and feedline regions. Preferably the coverage of the conductive and opaque material in feedline regions is between about 50% and about 150% of the coverage in touch electrode regions, and more preferably between about 80% and about 120%, for example, to provide the best visual appearance.

Therefore, there is uniform ambient reflection across the display panel and uniform light emission from the pixels. This ensures that no or substantially no undesirable patterns are visible and that all areas of the display panel have the same or substantially the same viewing characteristics at all viewing angles. In addition, the optical uniformity is achieved without increasing the RC constant of the feedlines.

Figure 8:
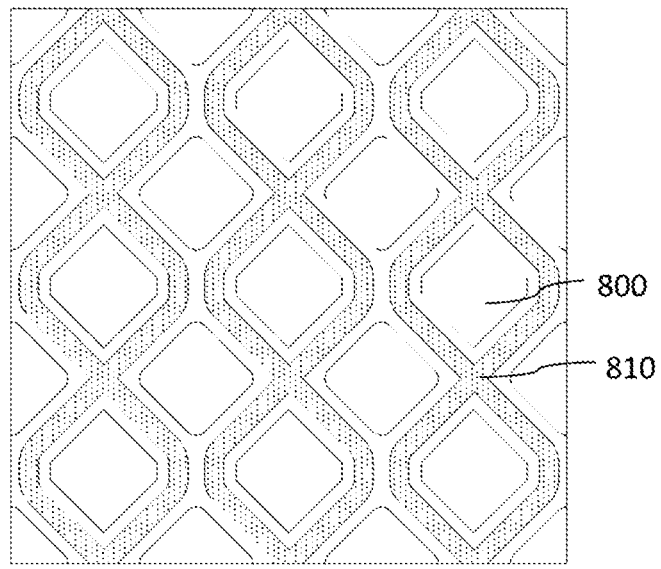
FIG. 8 shows feedlines in a preferred embodiment of the present invention in a representative portion of the OLED display panel with the second pixel distribution layout.

FIG. 8 shows feedlines 810 in another preferred embodiment of the present invention in a representative portion of the OLED display panel with the second pixel distribution layout. FIG. 8 shows sub-pixels 800 within the column of sub-pixels which are fully surrounded by the conductive and opaque material of the feedline 810. The sub-pixels 800 are configured to include cut-off corners such that the separation between edges of adjacent sub-pixels is larger than for sub-pixels with right angled corners. In one example, as shown in FIG. 8, the main edges of the sub-pixels are at an angle of about 45° to the direction between the sub-pixel and an adjacent sub-pixel in the same column, and the "cut-off-corner" includes an edge which is approximately parallel to the above-described direction. Consequently, there is a larger distance between the sub-pixel and an adjacent sub-pixel in the same row. In this configuration, the width (measured in a horizontal direction in FIG. 8) of the conductive and opaque material of the feedline 810 is the same at locations where two adjacent feedlines 810 come closest to one another as the width of the remainder of the conducting path between the locations where the conducting paths are connected above and below each sub-pixel, a separation can be provided between the edge of the sub-pixel 800 and the feedline 810 to avoid blocking of light from the pixel which would otherwise be directly emitted from the display, and there is sufficient space to avoid electrical contact between the two adjacent feedlines. Sub-pixels with rounded corners may be used similarly to sub-pixels with cut off corners. Advantageously, by increasing the separation between adjacent feedlines 810, the probability of touch sensor failure due to, for example, a short circuit caused by a manufacturing defect between adjacent feedlines 810 is reduced or eliminated and the display panel yield is improved.

FIG. 8 shows another feature whereby at the points where the two paths of a single feedline 810 combine above and below the sub-pixels, the distance from the feedline 810 to the edge of the sub-pixels 800 is the same or substantially the same. By maintaining at least a minimum separation (measured in a plan view), and preferably a uniform separation between the edge of the sub-pixel 800 and the feedline 810 around the sub-pixel 800, the blocking of light from the sub-pixel 800 which would otherwise be emitted from the display for high viewing polar angles may be avoided, reduced, or at least made uniform for different azimuthal viewing directions. Preferably, the conductive and opaque material does not cause any significant change to the light emission from the display across all viewing angles. Furthermore, by maintaining the width of each conducting path, the resistance of the feedline 810 is kept low.

Figure 9:
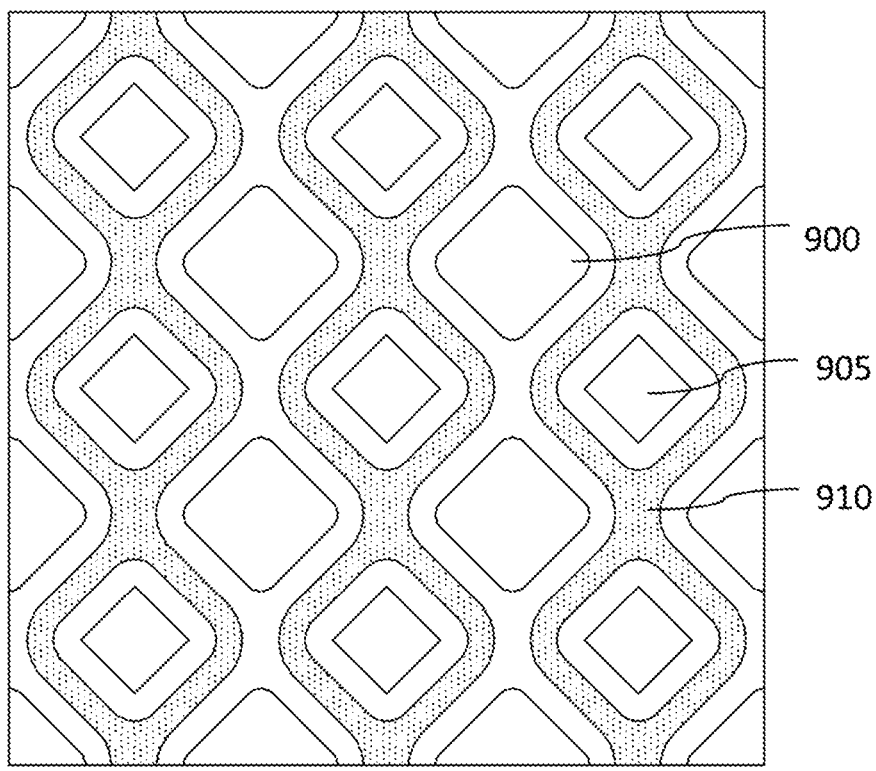
FIG. 9 shows feedlines in a preferred embodiment of the present invention in a representative portion of the OLED display panel with the second pixel distribution layout.

FIG. 9 shows feedlines 910 in another preferred embodiment of the present invention in a representative portion of the OLED display panel with the second pixel distribution layout which includes two different sizes of sub-pixels. The display panel of FIG. 9 preferably includes at least two groups of sub-pixels 900, 905 where the sizes of the sub-pixels 900, 905 are different. The conductive and opaque material of the feedline 910 is patterned around the sub-pixel column which includes the smaller sub-pixels 905. Preferably, the entire column includes only the smaller sub-pixels but every other (or fewer) sub-pixel 905 in the column may be of the smaller size. Preferably the smaller sub-pixels 905 are in every second column of the display, as is the case in FIG. 9. In the configuration of FIG. 9, the same distance between the edges of the sub-pixels 900, 905 and the feedlines 910 may be maintained and still a large separation between adjacent feedlines 910 where they come closest together is provided. Therefore, the yield of the panel can be increased because a short circuit between adjacent feedlines 910 is less probable. Further, it is also possible to provide preferred embodiments of the present invention which include more than two sizes of sub-pixels.

All references to columns of sub-pixels herein can also be applied equally to rows of sub-pixels, and vice versa. Feedlines may be configured according to preferred embodiments of the present invention in both rows and columns in different regions of the same display device.

An advantage achieved by the preferred embodiments shown in FIGS. 6, 8, and 9 is that the total coverage of the conductive and opaque material in these feedline regions is similar to that in touch electrode regions (e.g., as in FIG. 1C), thereby ensuring a low visible difference between the feedline regions and touch electrode regions.

It should be understood that the foregoing description is only illustrative of preferred embodiments of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. A display device comprising:
   a display panel including a plurality of sub-pixels;
   a touch sensor electrode that is made of a first conductive and opaque material layer that is located directly on the display panel and overlaps a portion of the display panel in between a portion of the plurality of sub-pixels; and
   a feedline that is made of a second conductive and opaque material layer that is connected to the touch sensor electrode, overlaps a portion of the display panel in between some of the plurality of sub-pixels that is not overlapped by the touch sensor electrode, defines a pair of conductors around a sub-pixel in one or more columns of sub-pixels of the plurality of sub-pixels such that the pair of conductors are electrically connected above and below each sub-pixel in the one or more columns, and routes the touch sensor electrode to a touch sensor controller.

2. The display device of claim 1, wherein the touch sensor electrode and the feedline overlap a non-emissive region between the plurality of sub-pixels.

3. The display device of claim 1, wherein a distance between an edge of the feedline and a nearest edge of the sub-pixel in the one or more columns of sub-pixels is constant or substantially constant around the sub-pixel in the one or more columns of sub-pixels.

4. The display device of claim 1, wherein a distance between an edge of the feedline and a nearest edge of the sub-pixel in the one or more columns of sub-pixels is more than a distance where light directly emitted from the sub-pixel in the one or more columns of sub-pixels is blocked by the feedline.

5. The display device of claim 1, wherein the sub-pixel in the one or more columns of sub-pixels includes at least two rounded corners or cut-off corners at corners where the sub-pixel in the one or more columns of sub-pixels is closest to an adjacent sub-pixel in a same row of sub-pixels.

6. The display device of claim 1, wherein
   the plurality of sub-pixels include an edge at an angle of about 45° to an edge of the display device;
   a direction of the one or more columns of sub-pixels is parallel or substantially parallel to the edge of the display device; and
   the direction of the one or more columns of sub-pixels is a direction between a first sub-pixel and an adjacent sub-pixel in the one or more columns of sub-pixels.

7. The display device of claim 6, wherein
   the sub-pixel in the one or more columns of sub-pixels includes an edge parallel or substantially parallel to the direction of the one or more columns of sub-pixels; and
   the edge parallel or substantially parallel to the direction of the one or more columns of sub-pixels is an edge of the sub-pixel closest to an adjacent sub-pixel in a direction perpendicular or substantially perpendicular to the direction of the one or more columns of sub-pixels.

8. The display device of claim 1, wherein the first conductive and opaque material and the second conductive and opaque material are the same.

9. The display device of claim 1, wherein
   the plurality of sub-pixels includes at least two different sizes of sub-pixels;
   the feedline is patterned around a sub-pixel column that includes same sized sub-pixels;
   the feedline is a same distance between the plurality of sub-pixels; and
   a closet separation between adjacent feedlines is greater than a separation between the feedline and the one of the plurality of sub-pixels.

10. The display device of claim 1, wherein
    the plurality of sub-pixels includes at least two different sizes of sub-pixels; and
    the feedline is patterned around a sub-pixel column that includes smallest sized sub-pixels of the plurality of sub-pixels.

11. The display device of claim 1, wherein the touch sensor controller uses a measurement of self-capacitance of the touch sensor electrode.

12. The display device of claim 1, wherein the plurality of sub-pixels each include an organic light-emitting diode.

13. A plurality of sub-pixels of a display panel comprising:
    a series of sub-pixels that are adjacent to each other;
    a touch sensor electrode that is made of a first conductive and opaque material layer that is located directly on the display panel and overlaps a portion of the display panel in between a portion of the plurality of sub-pixels; and
    a feedline that is made of a second conductive and opaque material layer that is connected to the touch sensor electrode, overlaps a portion of the display panel in between some of the plurality of sub-pixels that is not overlapped by the touch sensor electrode, defines a pair of conductors around a sub-pixel in the series of sub-pixels such that the pair of conductors are electrically connected adjacent to opposite corners of each sub-pixel in the series of sub-pixels, and routes the touch sensor electrode to a touch sensor controller.

14. The plurality of sub-pixels of claim 13, wherein the touch sensor electrode and the feedline overlap a non-emissive region between the plurality of sub-pixels.

15. The plurality of sub-pixels of claim 13, wherein a distance between an edge of the feedline and a nearest edge of the sub-pixel in the series of sub-pixels is constant or substantially constant around the sub-pixel in the series of sub-pixels.

16. The plurality of sub-pixels of claim 13, wherein the first conductive and opaque material and the second conductive and opaque material are the same.

17. The plurality of sub-pixels of claim 13, wherein the sub-pixel in the series of sub-pixels includes at least two rounded corners or cut-off corners at corners where the sub-pixel in the series of sub-pixels is closest to an adjacent sub-pixel in a same row of sub-pixels.

18. The plurality of sub-pixels of claim 13, wherein
the plurality of sub-pixels include an edge at an angle of about 45° to an edge of a display device;
a direction of the series of sub-pixels is parallel or substantially parallel to the edge of the display device; and
the direction of the series of sub-pixels is a direction between a first sub-pixel and an adjacent sub-pixel in the series of sub-pixels.

19. The plurality of sub-pixels of claim 18, wherein
the sub-pixel in the series of sub-pixels includes an edge parallel or substantially parallel to the direction of the series of sub-pixels; and
the edge parallel or substantially parallel to the direction is an edge of the sub-pixel which is closest to an adjacent sub-pixel in a direction perpendicular or substantially perpendicular to the direction of the series of sub-pixels.

20. The plurality of sub-pixels of claim 13, wherein
the plurality of sub-pixels includes at least two different sizes of sub-pixels;
the feedline is patterned around same sized sub-pixels in the series of sub-pixels;
the feedline is a same distance from sub-pixels in the series of sub-pixels; and
a closet separation between adjacent feedlines is greater than a separation between the feedline and the sub-pixels in the series of sub-pixels.

* * * * *